United States Patent
Eberhardt et al.

(10) Patent No.: US 11,009,205 B2
(45) Date of Patent: May 18, 2021

(54) CONVERSION ELEMENT, OPTOELECTRONIC COMPONENT AND METHOD FOR PRODUCING A CONVERSION ELEMENT

(71) Applicant: OSRAM GmbH, Munich (DE)

(72) Inventors: Angela Eberhardt, Augsburg (DE); Florian Peskoller, Ingolstadt (DE); Jörg Frischeisen, Schwabmünchen (DE); Thomas Huckenbeck, Augsburg (DE); Michael Schmidberger, Schwabmünchen (DE); Jürgen Bauer, Wielenbach (DE); Dennis Sprenger, Röthenbach (DE); Jürgen Hager, Herbrechtingen (DE); Maximilian Vogl, Augsburg (DE); Oliver Woisetschläger, Sontheim an der Brenz (DE); Vera Stöppelkamp, Augsburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/488,216

(22) PCT Filed: Feb. 16, 2018

(86) PCT No.: PCT/EP2018/053911
§ 371 (c)(1),
(2) Date: Aug. 22, 2019

(87) PCT Pub. No.: WO2018/158090
PCT Pub. Date: Sep. 7, 2018

(65) Prior Publication Data
US 2020/0116322 A1    Apr. 16, 2020

(30) Foreign Application Priority Data
Feb. 28, 2017  (DE) .......................... 102017104128.1

(51) Int. Cl.
*F21S 41/176*   (2018.01)
*F21S 41/16*    (2018.01)
(Continued)

(52) U.S. Cl.
CPC ............. *F21S 41/176* (2018.01); *C09K 11/02* (2013.01); *C09K 11/08* (2013.01); *F21S 41/16* (2018.01);
(Continued)

(58) Field of Classification Search
CPC ........ F21V 9/30; H01L 33/502; G03B 21/204
See application file for complete search history.

(56) References Cited

U.S. PATENT DOCUMENTS 7,042,020 B2   5/2006  Negley
8,597,543 B2  12/2013  Le Toquin
(Continued)

FOREIGN PATENT DOCUMENTS

DE   102010024758 A   3/2011
DE   102005012953 B4  11/2012
(Continued)

*Primary Examiner* — Evan P Dzierzynski
(74) *Attorney, Agent, or Firm* — Slater Matsil, LLP

(57) ABSTRACT

A conversion element, an optoelectronic component, an arrangement and a method for producing a conversion element are disclosed. In an embodiment an arrangement includes a conversion element including a wavelength converting conversion material, a matrix material in which the conversion material is embedded and a substrate on which the matrix material with the embedded conversion material is directly arranged, wherein the matrix material comprises at least one condensed sol-gel material selected from the group consisting of water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysi-
(Continued)

lane, titanium alkoxide, silica sol, metal alkoxide, metal oxane, and metal alkoxane, and a laser source configured to emit primary radiation during operation, wherein the conversion element is arranged in a beam path of the laser source, wherein the conversion element is mechanically immovably mounted with respect to the laser source, and wherein the primary radiation of the laser source is dynamically arranged to the conversion element.

19 Claims, 14 Drawing Sheets

(51) Int. Cl.
*F21V 9/32* (2018.01)
*C09K 11/02* (2006.01)
*C09K 11/08* (2006.01)
*F21W 131/406* (2006.01)

(52) U.S. Cl.
CPC ......... *F21V 9/32* (2018.02); *F21W 2131/406* (2013.01)

(56) References Cited

U.S. PATENT DOCUMENTS

| | | | |
|---|---|---|---|
| 8,772,821 B2 | 7/2014 | Eberhardt et al. | |
| 8,854,725 B2 | 10/2014 | Hamada et al. | |
| 9,360,175 B2 | 6/2016 | Eberhardt et al. | |
| 9,547,225 B2 | 1/2017 | Ohno et al. | |
| 10,230,024 B2 | 3/2019 | O'Brien et al. | |
| 10,297,729 B2 | 5/2019 | Eberhardt et al. | |
| 10,439,109 B2 | 10/2019 | Borrelli et al. | |
| 2011/0090683 A1 | 4/2011 | Petry et al. | |
| 2014/0072812 A1 | 3/2014 | Hamada et al. | |
| 2015/0092391 A1 | 4/2015 | Eberhardt et al. | |
| 2015/0211712 A1 | 7/2015 | Yoshimura et al. | |
| 2015/0286120 A1* | 10/2015 | Ohno | G02B 26/10 353/84 |
| 2016/0010812 A1* | 1/2016 | Kroell | G03B 21/008 353/84 |
| 2017/0003580 A1* | 1/2017 | Sheng | G03B 21/204 |

FOREIGN PATENT DOCUMENTS

| | | |
|---|---|---|
| DE | 102012210083 A1 | 12/2013 |
| DE | 102012210195 A1 | 12/2013 |
| DE | 102012220980 A1 | 5/2014 |
| DE | 112013002508 T5 | 4/2015 |
| DE | 102013021688 A1 | 6/2015 |
| DE | 102015113052 A1 | 2/2017 |
| JP | 2006518111 A | 8/2006 |
| JP | 2009132917 A | 6/2009 |
| JP | 2012168540 A | 9/2012 |
| JP | 2013232390 A | 11/2013 |
| JP | 2014017094 A | 1/2014 |
| JP | 2015521791 A | 7/2015 |
| JP | 2015142046 A | 8/2015 |
| JP | 2016534393 A | 11/2016 |
| WO | 2007125493 A2 | 11/2007 |
| WO | 2011138169 A1 | 11/2011 |
| WO | 2013047876 A1 | 4/2013 |
| WO | 2013186365 A1 | 12/2013 |
| WO | 2014103093 A1 | 7/2014 |

* cited by examiner

FIG 4A
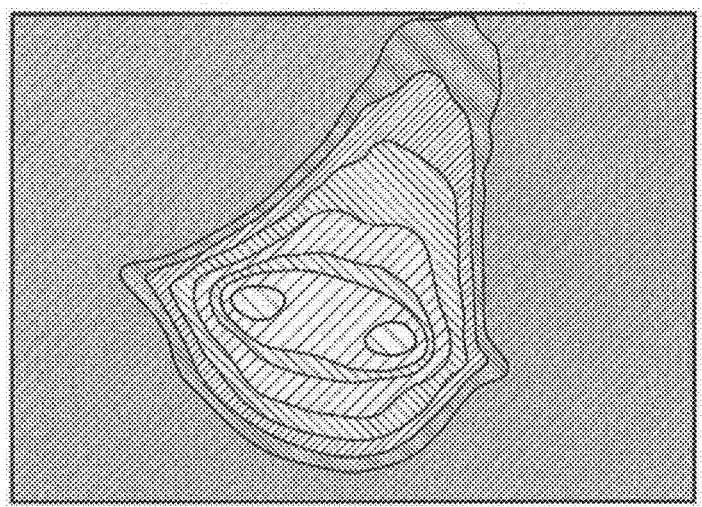
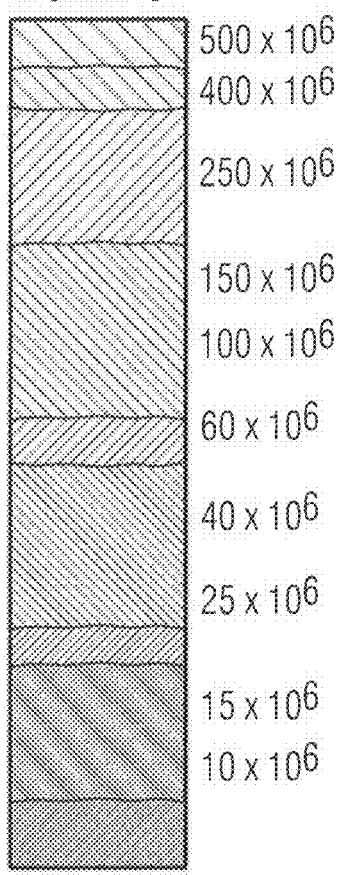
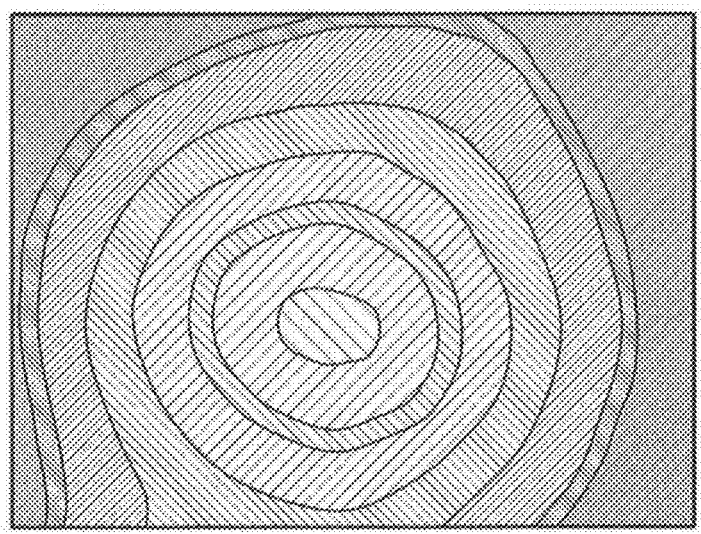
FIG 4B

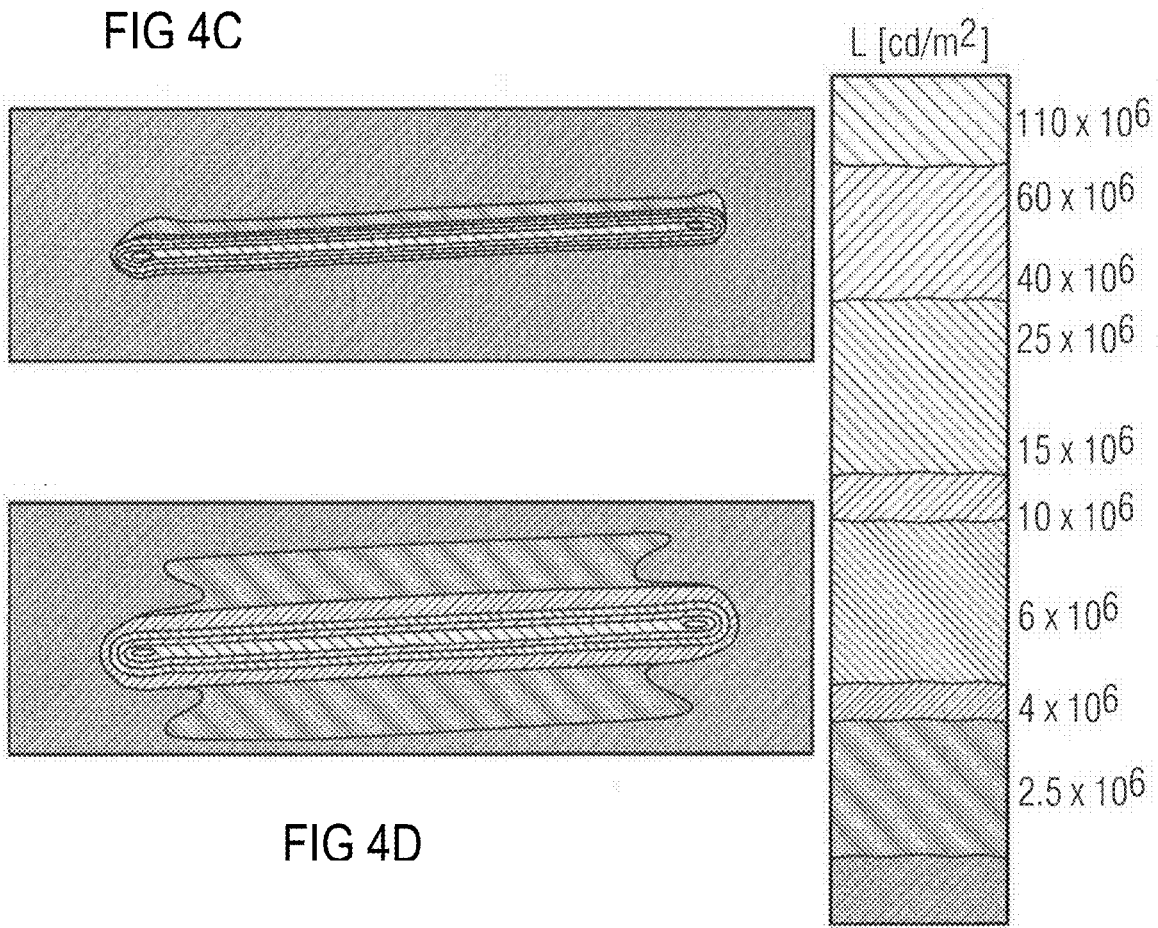

CONVERSION ELEMENT, OPTOELECTRONIC COMPONENT AND METHOD FOR PRODUCING A CONVERSION ELEMENT

This patent application is a national phase filing under section 371 of PCT/EP2018/053911, filed Feb. 16, 2018, which claims the priority of German patent application 102017104128.1, filed Feb. 28, 2017, each of which is incorporated herein by reference in its entirety.

TECHNICAL FIELD

The invention relates to a conversion element. The invention further relates to an optoelectronic component. The invention further relates to a method for producing a conversion element.

BACKGROUND

In so-called LARP applications (Laser Activated Remote Phosphor), it is necessary to generate a high luminance. In addition, a small spot widening is important, i.e., to what extent the illuminated area (for example, related to $1/e^2$ value of the maximum) of the converted radiation increases compared to the illuminated area (=excitation area) of the exciting laser beam, the contrast between areas that are to be illuminated and areas that are not to be illuminated (for example, for adaptive spotlights), the color homogeneity over the converter surface and over the beam angle, the efficiency and/or the stability (for example, against humidity, radiation, temperature, chemical influences etc. in order to guarantee a long life time of the component).

The term LARP applications are used here and in the following to refer to applications that use a laser source comprising at least one laser beam to make a conversion element usable as a light source. This does not exclude that part of the laser light is still present and can thus contribute to the total emission.

SUMMARY OF THE INVENTION

Embodiments provide a conversion element that is suitable for LARP applications, in particular stable for LARP applications or has a high luminance. Further embodiments provide an optoelectronic component suitable for LARP applications. Yet other embodiments provide a method for producing a conversion element which produces a stable conversion element.

In at least one embodiment, the conversion element comprises at least one or exactly one wavelength converting conversion material. The conversion element comprises at least one matrix material. The at least one conversion material is introduced or embedded in the matrix material. The conversion element comprises a substrate. The at least one matrix material and the at least one conversion material are arranged, in particular directly, onto or on the substrate.

Here, direct means that no further layers or elements are arranged between the matrix material and/or conversion material and the substrate. In other words, the conversion element can be attached to the substrate adhesive-free. The conversion element is therefore not attached to the substrate with another adhesive material. The substrate may have other layers, which, for example, form the coating of the substrate. The coating can be formed dichroically. Additionally or alternatively, the substrate can have an anti-reflection coating.

The matrix material comprises or consists of at least one condensed sol-gel material selected from the following group: water glass, metal phosphate, aluminum phosphate, monoaluminum phosphate, modified aluminum phosphate, alkoxytetramethoxysilane, tetraethylorthosilicate, methyltrimethoxysilane, methyltriethoxysilane, titanium alkoxide, silica sol, metal alkoxide, metalloxane, metalalkoxane. The conversion element is arranged in the beam path of a laser or light source.

The conversion element is optionally mounted mechanically immovable with respect to the laser source or light source. Here, mechanically immovable means in particular that the relative spatial position of the conversion element and the laser source does not change. The laser source can comprise at least one laser beam whose beam direction does not change spatially relative to the conversion element. Alternatively, the laser source, preferably including primary beam-guiding optics, can have at least one laser beam that can vary its beam direction. The variation of the beam direction can be realized by different technologies. This includes, for example, MEMS (micro-electro-mechanical system) elements or piezo drives, but also polygon mirrors/rotating rollers, but also typical technologies used in CD and blue ray players such as "Voice Coil Actuators" can be used here. In general, all technologies can be used that allow a laser beam to be scanned over the converter together with primary optical elements. The converter can be used in transmittive or reflective configuration. The described converter element can be used particularly advantageously in combination with such technologies in a system in scanning LARP systems, especially in the AM field (AM=automotive). A detailed description of these systems is presented below.

The deflection occurs preferably or exclusively via the movement of either one or more optical elements such as mirrors and/or lenses.

In particular, the radiation of the laser source is dynamically arranged to the conversion element.

The inventors have recognized that the use of the conversion element described here in a LARP assembly has improved heat dissipation, radiation and temperature stability compared to a conventional conversion element comprising organic matrix materials such as silicones or epoxides.

Very thin layers comprising a high proportion of conversion material in the matrix material can be produced. The conversion element can exhibit high light scattering and is preferably formed exclusively from inorganic materials. Preferably, the conversion material and the matrix material are arranged on a transmissive substrate. In other words, the matrix material can be highly filled with the conversion material and thus very thinly shaped as a layer. In addition, the conversion element may have a scattering over pores in the layer and over refractive index differences of the materials. The matrix material with the conversion material is formed in particular as a layer and can be applied directly to the substrate, i.e., without an additional organic or inorganic adhesive layer.

Previously known conversion elements for LARP applications show the disadvantage of spot widening and/or poor contrast. However, these parameters are very important, for example, for automotive applications, such as the use of conversion elements in a headlight, especially for applications targeting an ADB (Advanced Driving Beam) system, also known as "Glare-Free HB". These systems can be realized with one of the above mentioned beam direction deflection technologies. Here, one or more laser beams are scanned over a conversion element. This can be realized in one or two dimensions. The resulting local converted light distribution is imaged into the far field by secondary optics. By synchronizing the laser driver and beam deflection elements, a targeted control of the light distribution can be achieved, including switching off and/or dimming the laser and thus also the resulting light distribution in certain areas. This can be used to fade out other road users (oncoming and preceding vehicles, etc.). As soon as these have disappeared from the field of vision of the headlights, the de-glaring zone can be fully illuminated again. In order to achieve good performance especially in vertical and horizontal de-glaring zones, it is essential to optimize the topics of spotlight widening and contrast. Examples and measurement data for the advantages to be achieved here can be found in the corresponding figures. Legal regulations can be found in the well-known ECE-R 123 standard, for example, the use of conversion elements in a headlight.

But also other light distributions such as dimmed headlights or fog lights require sufficient sharpness and contrast in the vertical direction to meet the legal requirements of ECE-R 19 and ECE-R 112.

According to at least one embodiment, the conversion element comprises at least one wavelength converting conversion material. The conversion material absorbs radiation with a first dominant wavelength (and a surrounding spectral range, if applicable) and converts radiation with a second dominant wavelength (and a surrounding spectral range, if applicable) that is preferably greater than the first dominant wavelength. The dominant wavelength is known to a person skilled in the art and is therefore not explained in detail at this point. Inorganic materials with wavelength-converting properties can preferably be used as conversion materials. For example, a well-known phosphor such as garnet, orthosilicate and/or nitridosilicate is suited as conversion material. Materials for the conversion material are, for example:

$(Y,Gd,Tb,Lu)_3(Al,Ga)_5O_{12}:Ce^{3+}$;
$(Sr,Ba,Ca,Mg)_2Si_5N_8:Eu^{2+}$;
$(Ca,Sr)_8Mg(SiO_4)_4Cl_2:Eu^{2+}$;
$(Sr,Ba,Ln)_2Si(O,N)_4:Eu^{2+}$ with Ln: at least one element of the lanthanides;
$(Sr,Ba)Si_2N_2O_2:Eu^{2+}$;
$(Ca,Sr,Ba)_2SiO_4:Eu^{2+}$;
$(Sr,Ca)AlSiN_3:Eu^{2+}$;
$(Sr,Ca)S:Eu^{2+}$;
$(Sr,Ba,Ca)_2(Si,Al)_5(N,O)_8:Eu^{2+}$;
$(Sr,Ba,Ca)_3SiO_5:Eu^{2+}$;
$\alpha$-SiAlON:$Eu^{2+}$;
$\beta$-SiAlON:$Eu^{2+}$;
$Ca(5-\delta)Al(4-2\delta)Si(8+2\delta)N_{18}O:Eu^{2+}$; and
other phosphors, luminescent materials such as quantum dots, organic dyes or luminescent glass.

According to at least one embodiment, the conversion material and/or matrix material is produced on the substrate by doctor blading, screen printing, stencil printing, dispensing, spray coating, spin coating, electrophoretic deposition or by a combination of these different methods.

According to at least one embodiment, the conversion element comprises a substrate. The substrate can be formed transmissive or transparent. Here and in the following, a substrate is referred to as transparent if it has an internal transmission of >90%, preferably >95%, particularly preferably >99%, in particular in the range of the wavelength of the primary radiation (laser). Here, internal transmission means transmission without reflection at the surfaces (Fresnel reflection).

Alternatively, the substrate can also be formed reflectively, preferably with a reflectance between 0.95 and 1, in particular in the range of the wavelengths of the primary radiation and/or the secondary radiation.

Materials selected from the following group can be used as substrates: sapphire, ceramics, glass, glass-like materials, glass ceramics, and other transparent or translucent materials. Alternatively, the substrate may comprise a material or a combination of the following materials: aluminum oxide, polycrystalline aluminum oxide, ceramics, aluminum, copper, metals, highly reflective aluminum with or through an applied coating system, e.g., of silver or a dichroic coating. The reflective formed substrates are suitable for the so-called reflective LARP and the transparent substrates for the transmissive LARP.

According to at least one embodiment, the substrate comprises a high thermal conductivity of >0.2 W/(m*K), preferably 0.5 W/(m*K), particularly preferably 0.7 W/(m*K) or to W/(m*K). In addition, the substrate can comprise good resistance towards moisture, radiation and/or temperatures, which is in particular advantageous for automotive applications. For example, the substrate shows no noticeable change in transmissive and reflective properties after, for example, a humidity test at 85° C. and 85% rel. humidity for >=100 h. In particular, no noticeable change means no measurable change or a maximum of 5% deterioration in the primary and/or secondary wavelength range. The same applies to the long-term temperature resistance at >=180° C., better >=200° C. for >=1 h, better >=5 h, ideally >=10 h as well as to the radiation resistance. Diamond has a thermal conductivity of approximately 2300 W/m*K. Sapphire of approximately 40 W/m*K. Both are very suitable for transparent materials. Glass has a thermal conductivity of about 0.75 W/m*K depending on the material.

The substrate can be structured. For example, the substrate may be a structured sapphire substrate or may be formed as one or more microlenses structured on the surface. The substrate may comprise a photonic crystal lattice on the surface. This is advantageous, in particular to increase light incoupling and/or decoupling and thus increase efficiency. On the other hand, an improved angle emission characteristic or beam shaping in one or several directions can be achieved. The surface of the substrate can be modified by roughening, sandblasting, grinding, polishing or etching.

The substrate may comprise a coating. The coating can, for example, comprise a scattering layer to increase light decoupling.

According to at least one embodiment, the conversion element comprises coatings. The coatings can be subordinate to the matrix material. The coatings can also be referred to as encapsulation. The encapsulation is intended to protect against environmental influences such as moisture.

The substrate may comprise functional coatings such as dichroic or interference coatings. These coatings may have antireflective properties or filter properties, such as transmission or reflection of certain wavelength ranges. For the so-called transmissive LARP applications, dichroic coatings are preferably used, which transmit most of the light emitted by the laser source and reflect most of the light emitted by the conversion material. It is advantageous if the dichroic coating or the layer stack is arranged between the substrate and the matrix material and the excitation takes place from the substrate side by a laser beam. Thus, a higher efficiency can be achieved because the transmission of the excitation laser beam can be increased and a large part of the emitted or scattered converted light in the direction of the substrate is reflected again in the forward direction.

The dichroic coating can be applied to the sapphire side facing the matrix material containing layer. In general, a dichroic coating consists of several thin layers with refractive index differences in order to use interferences for the wavelength- and direction-dependent change of radiation in the system. Here, the dichroic coating can have two main functions: On the one hand, it ensures a high transmission of the incoming laser radiation and, on the other hand, a high reflectivity of the converted light coming from the conversion element. Both effects increase the efficiency or effectiveness of the inverter system because more light could be used in the interesting top hemisphere. This functionality is known to a person skilled in the art and is therefore not explained in detail at this point.

The dichroic coating described above can alternatively or additionally be arranged on an arbitrary further outer side of the substrate and/or on its edge sides and/or on the side of the conversion element facing away from the substrate.

The substrate may comprise other configurations. For example, the substrate can be structured.

According to at least one embodiment, the conversion material is capable of absorbing the radiation of the laser source and converting it into radiation with a different longer wavelength and emitting it.

The conversion material may be capable of fully absorbing the radiation of the laser source, in particular of one or more laser beams, and emitting it with a different longer wavelength. In other words, a so-called full conversion takes place, so that the radiation of the laser source contributes not at all or to less than 5% of the resulting total radiation.

Alternatively, the conversion material is capable of partially absorbing the radiation of the laser source so that the total radiation exiting the conversion element is composed of the laser radiation and the converted radiation. This can also be referred to as partial conversion. The total radiation can be white mixed light.

According to at least one embodiment, the conversion material in the matrix material comprises a fraction of more than 50 wt %, better more than 60 wt %, preferably more than 65 wt % or more than 70 wt % or more than 75 wt % or more than 80 wt % or more than 85 wt % or more than 90 wt % or more than 95 wt %. The conversion material may comprises a volume fraction, for example, of more than 10 or 20 vol %, better more than 30 vol %, preferably more than 35 vol % or more than 40 vol % or more than 45 vol % or more than 50 vol % or more than 55 vol % or more than 60 vol % or more than 65 vol % or more than 70 vol % or more than 75 vol % in the matrix material. For example, the volume fraction is between 40 vol % and 85 vol % and the mass fraction is between 60 wt % and 90 wt %. This can provide a conversion element that is formed very thinly and comprises a high concentration of conversion material. The proportion of matrix material in the conversion element, for example, is max. 70 Vol %, better max. 65 Vol %, preferably max. 60 Vol % or max. 55 Vol % or max. 50 Vol % or max. 45 Vol % or max. 40 Vol % or max. 35 Vol % or max. 30 Vol % or max. 25 Vol % or max. 20 Vol % or max. 15 Vol % or max. 10 Vol % or max. 5 Vol %. This corresponds, for example, to a weight fraction of max. 60 wt %, better max. 55 wt %, preferably max. 50 wt % or max. 45 wt % or max. 40 wt % or max. 35 wt % or max. 30 wt % or max. 25 wt % or max. 20 wt % or max. 15 wt % or max. 10 wt % or max. 5 wt % of matrix material in the conversion element. For example, the volume fraction of the matrix is between 10 vol % and 65 vol % and the mass fraction between 5 wt % and 40 wt %.

According to at least one embodiment, the conversion element comprises a porosity of more than 0.1 vol % or more than 1 vol % or more than 2 vol % or more than 5 vol % or more than 10 vol %, better more than 15 vol %, preferably more than 20 vol % or more than 25 vol % or more than 30 vol % or more than 35 vol % or more than 40 vol % or more than 45 vol % or more than 50 vol % in the matrix material.

According to at least one embodiment, the matrix material of condensed sol-gel has a fraction between 10 and 65 vol % or between 5 and 40 wt %. Alternatively or additionally, the refraction difference to the conversion material is >0.2.

According to at least one embodiment, the conversion element can also contain organic conversion materials, such as organic dyes, or quantum dots.

According to at least one embodiment, the conversion element comprises scattering particles or fillers. The scattering particles or fillers can be, for example, aluminum oxide, aluminum nitride, titanium dioxide, silicon dioxide, zirconium dioxide, zinc oxide, other ceramic as well as vitreous particles, metal oxides or other inorganic particles. The scattering particles or the fillers can comprise different shapes, for example, spherical, rod-shaped or disc-shaped, wherein the particle size can be between a few nanometers and a few tens of micrometers. Smaller particles can be used to adjust the viscosity of the suspension during coating. Larger particles can contribute to the production of a compact conversion element and/or to the improvement of heat dissipation, humidity resistance, or thickness homogeneity. The scattering can be different and/or the mechanical stability can be improved.

According to at least one embodiment, the conversion element comprises scattering particles or fillers. The scattered particles or fillers can be, for example, aluminum oxide, aluminum nitride, barium sulphate, boron nitride, magnesium oxide, titanium dioxide, silicon dioxide, silicon nitride, YAG, orthosilicate, zinc oxide or zirconium dioxide as well as AlON, SiAlON or combinations or derivatives thereof or other ceramic or vitreous particles, metal oxides or other inorganic particles. The scattering particles or the fillers can comprise different shapes, for example, spherical, rod-shaped or disc-shaped, wherein the particle size can be between a few nanometers and a few tens of micrometers.

According to at least one embodiment, the conversion element comprises additives. An additive can be aerosil or silica, such as sipernate, for example. Thus, the viscosity of the suspension can be modified and the proportion between the liquid and solid components can be adjusted.

According to at least one embodiment, the conversion element is produced from several layers, which can vary in layer thickness, compactness, matrix material, conversion material, scatterers and/or fillers.

According to at least one embodiment, the conversion element comprises a matrix material. The conversion material is incorporated in the matrix material, preferably dispersed. The conversion material can be homogeneously distributed in the matrix material. Alternatively, the conversion material may comprise a concentration gradient in the matrix material, for example, an increase in the concentration of the conversion material in the matrix material in the direction away from the laser source. For example, larger particles can be arranged closer to the substrate and smaller particles can be arranged on the surface of the conversion element, i.e., on the side facing away from the substrate. This reduces backscattering. In particular, the backscattering of the blue light, i.e., the light emitted by the laser beam, can be reduced.

According to at least one embodiment, the conversion material and/or matrix material is each inorganic. The conversion material preferably comprises no organic dyes as converter material. The matrix material preferably comprises no organic materials.

According to at least one embodiment, the matrix material comprises at least one sol-gel material or consists thereof. Sol-gel materials are referred to here and in the following as those materials which are produced by a sol-gel process. The sol-gel process is a method of producing inorganic or hybrid polymer materials from colloidal dispersions, the so-called sols. The starting materials are also referred to as precursor materials. In a first basic reaction, finest particles are formed from them in solution. Powders, fibers, layers or aerogels can be produced by the special further processing of the sols. The essential basic process of the sol-gel process is the hydrolysis of the precursor materials and the condensation between the reactive species produced thereby. The sol-gel process is sufficiently well known to a person skilled in the art and will not be explained in detail here at this point.

The sol-gel material can be condensed. This means that the sol-gel material is produced by condensation.

According to at least one embodiment, the sol-gel material is selected from the following group: water glass, monoaluminum phosphate, modified aluminum phosphate, metal phosphate, aluminum phosphate, alkoxytetramethoxysilane, tetraethylorthosilicate, methyltrimethoxysilane, methyltriethoxysilane, titanium alkoxide, silica sol, metal alkoxide, metal oxane, metal alkoxane.

According to at least one embodiment, the matrix material consists of aluminum phosphate, monoaluminum phosphate or a modified monoaluminum phosphate. Alternatively, the matrix material consists of water glass or water glass and a chemical hardener. Water glass is defined as vitreous, i.e., amorphous, water-soluble sodium, potassium and/or lithium silicates solidified from a melt or their aqueous solutions. Water glass thus differs from conventional glass particularly in its properties such as porosity.

The matrix material can at least consist of lithium water glass, sodium water glass, potassium water glass or a mixture thereof, or comprise these alkali water glasses. The inventors have recognized that a combination of lithium water glass and potassium water glass in particular has excellent properties for the matrix material. The ratio between lithium water glass and potassium water glass is preferably between 1:3 and 3:1. In particular, the ratio between lithium water glass and potassium water glass is 1:3, 1:1 or 3:1, preferably 1:1.

For example, alkali water glasses may have a module from 1.5 to 5, preferably a module from 2.5 to 4.5.

According to at least one embodiment, the matrix material consists of water glass and a chemical hardener, which results in a further by-product in addition to any alkali carbonate produced. In the case of a phosphate hardener, this would be an alkali phosphate.

According to at least one embodiment, the matrix material is free of organic materials. Preferably, the matrix material is free of silicone and/or epoxy. This is an advantage because silicones and epoxides can degenerate under the influence of blue light. They do this particularly under the influence of high temperatures and high radiation density of blue or short-wave light, as commonly found in LARP applications. Therefore, if the matrix material contains silicone and/or epoxy, it can irreversibly degenerate. With scanning LARP, this is in particular critical for a failure of the light-deflecting element, which increases the average blue power density in the part of the converter where the spot is located several times over.

According to at least one embodiment, the matrix material comprises aluminum phosphate, monoaluminum phosphate or a modified monoaluminum phosphate or water glass, wherein the conversion material is capable of absorbing the radiation of the laser source and converting it at least partially into radiation of a different wavelength, wherein the conversion element is deposited on a substrate of sapphire, wherein the substrate is arranged in the beam path of the radiation emitted or absorbed by the conversion material or in the beam path of the laser radiation.

According to at least one embodiment, the matrix material additionally comprises a chemical hardener. By adding a chemical hardener, preferably a phosphate, and curing the matrix material, for example, between 150° C. and 350° C. for water glass, it is possible to produce a conversion element that is very stable towards humidity. In particular, this conversion element has a high stability at 85° C., 85% relative humidity and 1000 hours for the test duration, which was determined by means of a humidity test. Preferably, no chemical hardener is added to aluminum phosphate, monoaluminum phosphate or modified monoaluminum phosphate. The aluminum phosphate, monoaluminum phosphate or modified monoaluminum phosphate described here preferably has a molar ratio of Al to P of 1:3 to 1:1.5 and cures in particular at temperatures between 300° C. and 400° C. The solutions may contain further elements or compounds, but preferably a maximum of 1 mol % of alkali and halogen compounds.

The inventors have recognized that when using water glass or aluminum phosphate or monoaluminum phosphate or modified monoaluminum phosphate, a conversion element can be produced with an inorganic matrix material that can be cured at low temperatures with long-term stability compared to organic matrix materials or organic sol-gel materials such as alkoxisilanes (TEOS), alkoxides, and alkoxanes. Low curing temperatures are advantageous to avoid damages to the substrate, for example, or to an encapsulation or another coating, such as a dichroic coating. A permanent or lasting damage of the phosphor during the embedding process is also avoided or minimized. The use of organic or partially organic sol-gel materials is possible, but not preferred, because the chemical reaction is not complete at such low temperatures. This can lead to instability of the conversion element and thus to a reduction in lifetime.

According to at least one embodiment, the laser source comprises at least one laser beam with a dominant wavelength of 410-490 nm, preferably 430-470 nm, particularly preferably 440-460 nm. Alternatively, more than one laser beam, for example, six laser beams, can form the laser source, which is guided together as a stack in parallel over the converter. One or more lasers with the same or different wavelengths can be used as the laser source.

According to at least one embodiment, the laser beam comprises a wavelength from the blue spectral range. Alternatively, other wavelengths such as those selected from the UV, green, yellow, orange and red spectral range can also be used.

According to at least one simple embodiment, the radiation of the laser source impinges directly on the conversion element during operation. In other words, no further layers, elements, lenses or optical elements are arranged between the laser source and the conversion element. Usually, however, especially when using several laser diodes, a primary optical system is used to pre-collimate the laser light, possibly combine it in a beam combiner and form the beam path. Depending on the application and installation space, this primary optics can contain all common elements, e.g., lenses and lens stacks/arrays, or also reflective optical elements. The use of refractive optical elements is also possible. The use of dichroic mirrors is also possible. This can be formed from several layers and, for example, have an alternating sequence of titanium dioxide and silicon dioxide layers.

Furthermore, the system can be used as reflective LARP and transmissive LARP with respect to the converter element. Reflective LARP refers to a system in which, unlike transmissive LARP, the laser does not exit opposite the entrance side of the laser radiation of the conversion medium, but is reflected and exits also at the original entrance side of the laser radiation.

According to at least one embodiment, the conversion element is formed as a layer with a maximum layer thickness of 70 µm, better maximum 60 µm, preferably maximum 30 µm or maximum 45 µm or maximum 40 µm or maximum 35 µm or maximum 30 µm or maximum 25 µm or maximum 20 µm for partial conversion. For full conversion, the conversion element is formed with a maximum layer thickness of 150 µm, better 130 µm maximum, preferably maximum 110 µm or maximum 90 µm or maximum 80 µm or maximum 70 µm or maximum 60 µm or maximum 50 µm or maximum 40 µm.

For example, the conversion element has a layer thickness between 10 and 30 µm after curing. As an advantage, the heat generated in the conversion material can be easily dissipated and spot widening can be kept to a minimum.

Embodiments provide an optoelectronic component. Preferably, the optoelectronic component comprises a conversion element described here. All definitions and specifications of the conversion element also apply to the optoelectronic component and vice versa.

According to at least one embodiment, the component comprises a laser source that emits radiation during operation, a conversion element which at least partially converts the radiation emitted by the laser source into a radiation with a different longer wavelength, and a layer stack which is arranged between the laser source and the conversion element and at least partially reflects the radiation emitted by the conversion element and is permeable to the radiation emitted by the laser source. The conversion element comprises a substrate which may have a dichroic coating. The dichroic coating can transmit the light of the laser source mainly at perpendicular or nearly perpendicular incidence, while it partly reflects it at larger angles, for example, when laser light is backscattered in the conversion element and impinges on the dichroic mirror at different angles.

The layer stack can be formed from titanium dioxide and silicon dioxide layers, which are preferably arranged alternately. The layer stack is located between the laser source and the conversion element. The radiation emitted by the conversion element can thus be reflected by the layer stack and the radiation emitted by the laser source can pass through the layer stack. Alternatively, the layer stack can be composed of tantalum (V) oxide and silicon dioxide layers.

According to at least one embodiment, the radiation of the laser source is arranged dynamically or statically to the conversion element.

According to at least one embodiment, the radiation of the laser source impinges on the conversion element via a transmissive substrate during operation.

Embodiments also provide an optoelectronic component. All specifications made about the conversion element and its production also apply to the optoelectronic component and vice versa.

According to at least one embodiment, the optoelectronic component comprises: a laser source that emits radiation during operation, a conversion element described herein comprising a dichroic layer stack arranged between substrate (2) and matrix material (3), wherein at least a part of the radiation of the laser source (1) transmits the substrate and the dichroic layer stack, and the conversion material (4) converts the transmitted radiation into radiation of different longer wavelength, wherein the converted radiation is reflected by the dichroic layer stack.

Further embodiments provide a method for producing a conversion element. The method described here is preferably used to produce the conversion element described here. All definitions and specifications of the conversion element also apply to the method for producing a conversion element and vice versa.

In at least one embodiment, the method of producing a conversion element comprises the steps: A) providing a matrix material, B) introducing an inorganic wavelength converting conversion material into the matrix material, wherein the matrix material is condensed and is produced or cross-linked by a sol-gel process at a temperature between 150° C. and 400° C., wherein the matrix material is selected from the following group: water glass, metal phosphate, aluminum phosphate, monoaluminum phosphate, alkoxytetramethoxysilane, tetraethylorthosilicate, methyltrimethoxysilane, methyltriethoxysilane, titanium alkoxide, silica sol, metal alkoxide, metalloxane, metalalkoxane, and C) applying the matrix material and conversion material directly on a substrate. The substrate may have a dichroic coating arranged directly on the matrix material or conversion material.

With the conversion element described here, a smaller emitting light spot can be produced. This results in a better contrast between the surfaces which are to be illuminated and those which are not to be illuminated. This can be observed, for example, by reduced scattered radiation or a reduced halo or corona environment around the illuminated surface in comparison to ceramic converters, for example.

These advantages can be applied in particular in so-called scanning LARP systems for the automotive field. In addition, the conversion elements described here may have a higher luminance compared to ceramic converters. With other conversion elements, the spot widening is often so bad that the light area on the conversion element has to be defined by an additional aperture in order to avoid an unintended halo or corona effect. With embodiments of the present invention, it may be possible to omit such an aperture due to the small spot widening, thus reducing costs.

In addition, the efficiency can be increased, in particular for components with a high energy density and/or temperatures due to better heat dissipation. This reduces the temperature in the conversion materials and thus the thermal quenching of the conversion materials compared to organic matrix materials, which usually have a significantly poorer thermal conductivity of <0.5 W/(m*K). The maximum operating performance and/or temperature can be increased before the so-called "thermal rollover" of the conversion material is generated or irreversible damage to the conversion element is caused.

The thermal rollover can occur as follows:

1. Heat is generated in the conversion element during operation (due to Stokes heat when converting from, for example, blue to yellow; due to losses due to quantum efficiency <100% or due to absorption).

2. At higher temperatures, most conversion materials possess thermal quenching, i.e., the quantum efficiency decreases as the temperature rises.

3. By thermal quenching, more heat is produced, which can lead to even more thermal quenching.

4. Thermal rollover occurs when, despite an increase in laser power (excitation), the total radiation or the converted radiation does not continue to rise but possibly even falls.

According to at least one embodiment, no adhesive layer is arranged between the substrate and the matrix material and/or conversion material. In other words, the matrix material with conversion material can be applied or attached directly to or on the substrate, for example, directly on the coating of the substrate. In comparison, ceramic converters have to be adhered, wherein the adhesive usually has a low thermal conductivity and maximum thermal resilience.

The production of the conversion material described here is cheaper compared to ceramic converters which have to be adhered to a substrate, in particular if different inorganic conversion materials are to be produced in one process step, for example, by spray coating or doctor blading. This means that several elements are processed at once, i.e., it is more practical and cheaper to adhere than individual ceramic converters. In addition, different conversion materials (e.g., garnets with different doping or different Al/Ga or Lu/Y content) or a mixture of conversion materials can be used for the conversion element described here. The conversion materials described here therefore have greater flexibility than ceramic converters with regard to setting the color location or the color rendering index (CRI) of the total radiation.

According to at least one embodiment, the conversion element is used in the automotive field, for example, in headlights. Alternatively, the conversion element can be used, for example, in projection applications, endoscopy or stage lighting.

The conversion element can be produced as a composite on a sapphire wafer. After the sapphire wafer has been coated, it can be separated, for example, by sawing. Such a process can improve homogeneity and yield and reduce process costs.

According to at least one embodiment, more than one conversion material is embedded in the matrix material. This allows the color location or color rendering index (CRI) to be adjusted. For example, a combination of green and red conversion materials can produce warm white mixed light. The change of the color location can change the visibility of a headlight or in a vehicle, for example, in rain, snow or fog.

According to at least one embodiment, the conversion material has an average particle diameter between 1 and 25 µm, in particular between 2 and 15 µm, preferably between 3 and 9 µm.

According to at least one embodiment, the conversion element is activated with an activator or dopant. The concentration of the dopant can be between 0.1% and 10%, for example, 3%, as with $(Y_{0.97}Ce_{0.03})_3Al_5O_{12}$. As dopant, for example, lanthanides or rare earths can be used, for garnet phosphors in particular Ce.

According to at least one embodiment, the conversion element has no holes. This means inhomogeneities in the conversion element, such as pores or other holes which are configured to transmit blue light without conversion or scattering. This can be influenced, for example, by the particle size of the conversion materials or by the dopant concentration or by the addition of fillers or scattering particles or by filling the pores or holes with additional (preferably inorganic) material. This is particularly important if a collimated laser light is to be scattered or converted by the conversion element.

BRIEF DESCRIPTION OF THE DRAWINGS

Further advantages, advantageous embodiments and further developments result from the following embodiments described in connection with the figures.

FIGS. 4A to 5B show the luminance according to an embodiment and comparison examples.

In the exemplary embodiments and figures, identical, similar or similarly acting constituent parts are provided with the same reference symbols. The depicted elements and their size relationships among one another should not be regarded as true to scale. Rather, individual elements such as layers, components, devices or areas may be exaggeratedly displayed too large for better representability and/or better understanding.

Figure 1A:
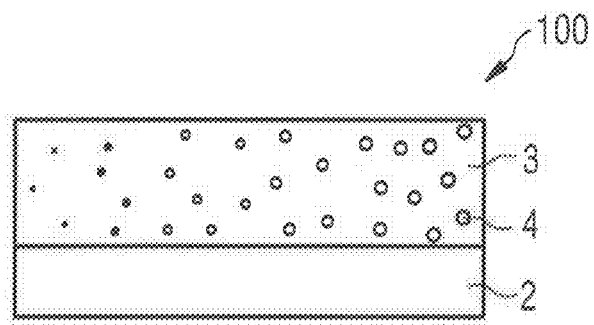
FIGS. 1A to 2F show conversion elements according to embodiments.
Figure 1B:
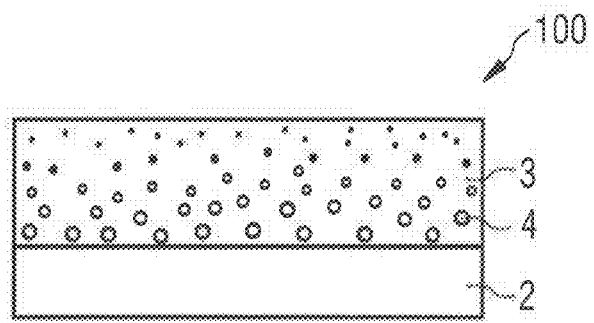

For example, FIGS. 1A and 1B show substrate 2, which is thinner than the layer thickness of the layer with matrix material 3, although the preferred layer thickness of substrate 2 (approx. 500 µm) is greater than the layer thickness of the layer with matrix material 3 (approx. 25 µm).

DETAILED DESCRIPTION OF ILLUSTRATIVE EMBODIMENTS

FIG. 1 shows a schematic cross-sectional illustration of a conversion element 100 according to an embodiment. The conversion element 100 comprises a substrate 2 on which a matrix material 3 is arranged. In the matrix material 3, the conversion material 4 is introduced, which is configured for wavelength conversion. In this example, the conversion material 4 is homogeneously distributed in the matrix material 3. FIG. 1B shows the distribution of conversion material 4 in matrix material 3 using a concentration gradient or grain size gradient. Larger particles of the conversion material 4 are arranged towards substrate 2, smaller particles are arranged towards the opposite side of substrate 1. Matrix material 3 can be, for example, water glass or monoaluminum phosphate or modified monoaluminum phosphate. A garnet such as YAG:Ce can be used as conversion material 4.

FIGS. 2A to 2D each show a side view of a conversion element 100 according to an embodiment that is arranged in a LARP arrangement. The distance laser-conversion element can comprise several cm.

Figure 2A:
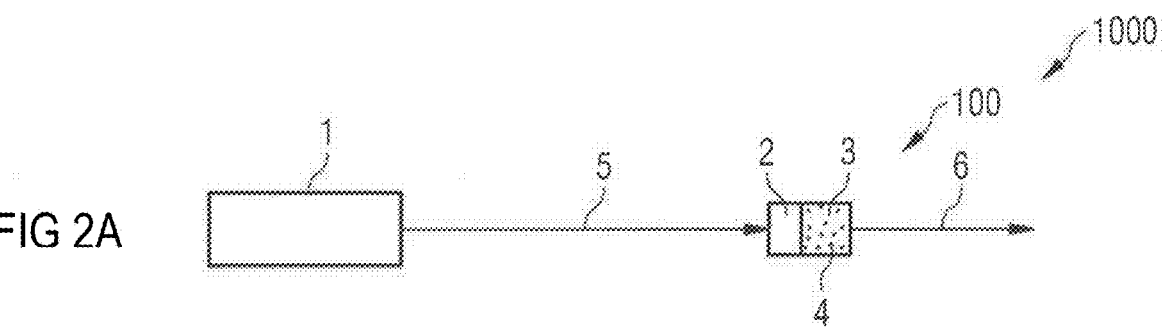

FIG. 2A shows a laser source 1 that is configured to emit a primary radiation or first radiation 5. The first radiation 5 impinges directly on substrate 2, which is, for example, sapphire and is transmissively formed. The matrix material 3 and the conversion material 4 are subordinate to the substrate 2. The conversion material 4 absorbs the primary radiation 5 and emits a secondary radiation 6. The conversion element 100 can be designed for full conversion or partial conversion. Preferably, the conversion element 100 is adhesive-free here or in the other exemplary embodiments.

Figure 2B:
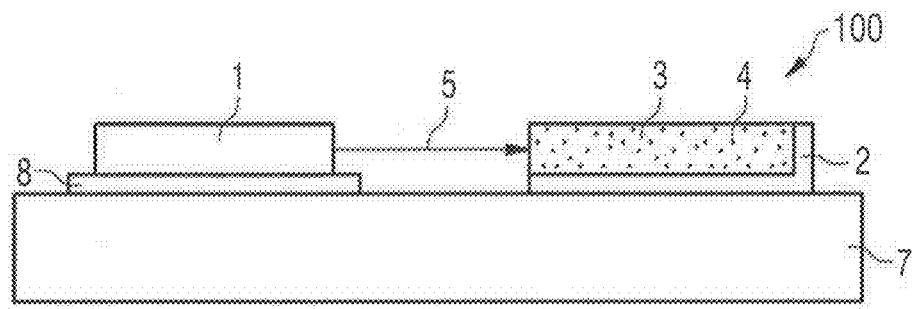

The conversion element according to FIG. 2B shows a substrate 2 that is formed reflectively. The substrate 2 extends over the base side of the matrix material 3, in which the conversion material 4 is embedded, and to a side surface of the matrix material 3. The primary radiation 5 emitted by the laser source 1 thus impinges directly on the matrix material 3, is converted by the conversion material 4 into radiation of different wavelength, and is reflected on the substrate 2. The laser source 1 can be arranged on a heat sink 8. Both the laser source 1 and the matrix material 3 and substrate 2 can also be arranged on a carrier 7. The carrier 7 can be, for example, a printed circuit board. Here, the laser beam 5 can irradiate vertically and/or at a certain angle to the conversion element 100.

In the embodiments of FIGS. 2A and 2B, the conversion element is mounted mechanically immovable with respect to the laser source. The laser beam of the laser source 1 may be capable of scanning or moving on the surface of the conversion element 100. This does not preclude that when the laser beam moves, the laser source 1 is mechanically immovable with respect to the conversion element 100.

Figure 2C:
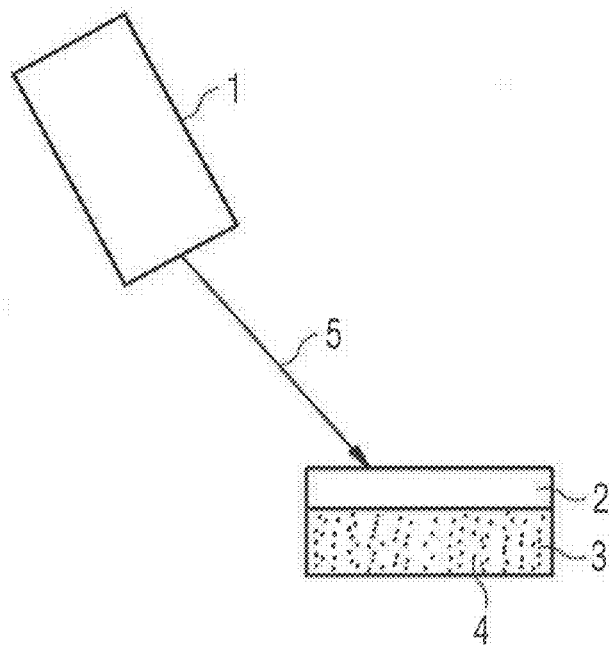
Figure 2D:
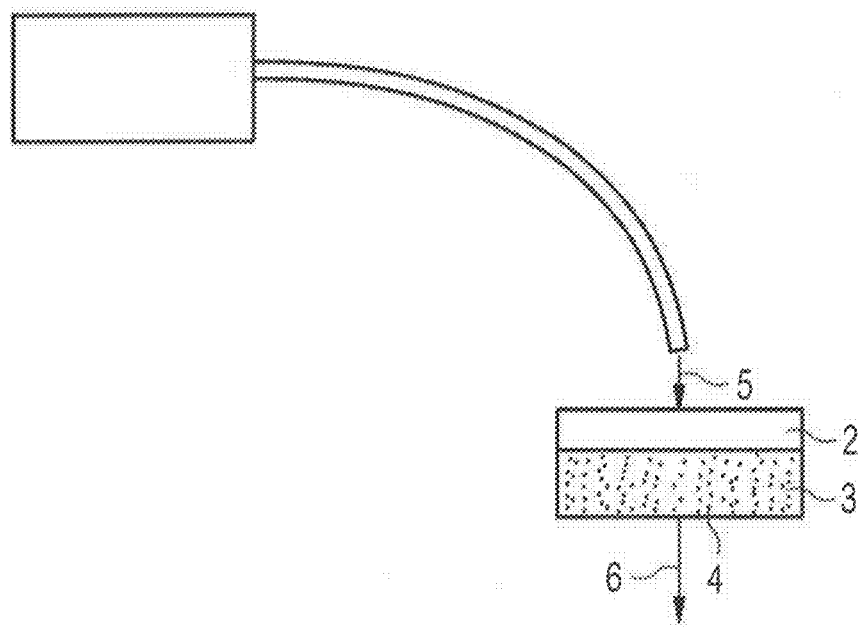

FIG. 2C shows the arrangement of laser source 1 at an angle to substrate 2 and matrix material 3. The same applies to the conversion element according to FIG. 2D. In the conversion element of FIG. 2D, the laser source 1 is integrated into a light guide. Matrix material 3 and substrate 2 can be designed analogously to the previous embodiments. In FIG. 2C, laser source 1 and substrate 2 with matrix material 3 are not arranged on a common carrier. The primary radiation 5 can impinge on the substrate 2 or matrix material 3 in a free-running manner, as shown in FIG. 2C, or via a light guide, as shown in FIG. 2D. The substrate 2 is formed transmissively. In the case of a reflective substrate 2, it is facing away from the laser beam 5 and impinges first on the matrix material 3.

Figure 2E:
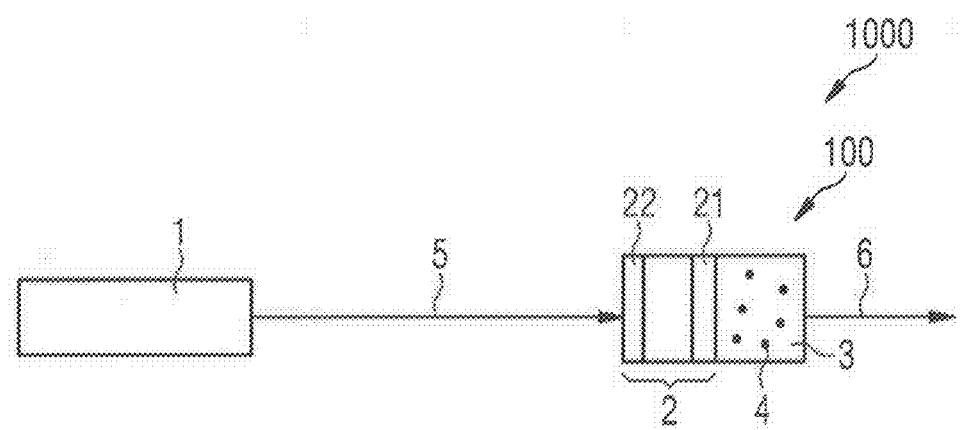
Figure 2F:
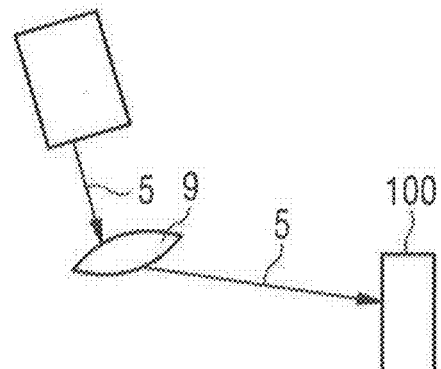

Between laser source 1 and the conversion element 100, optical elements such as lenses or collimators can be arranged (see FIG. 2F).

FIG. 2E essentially corresponds to the embodiment of FIG. 2A. Unlike FIG. 2A, FIG. 2E comprises a dichroic coating 21 and/or an anti-reflection coating 22 as part of substrate 2. The dichroic coating 21 is arranged directly on the matrix material 3. The anti-reflection coating 22 is arranged on the side of substrate 2 facing away from matrix material 3.

FIGS. 3A to 3I each show scanning electron microscopic images of a conversion element 100.

Figure 3A:
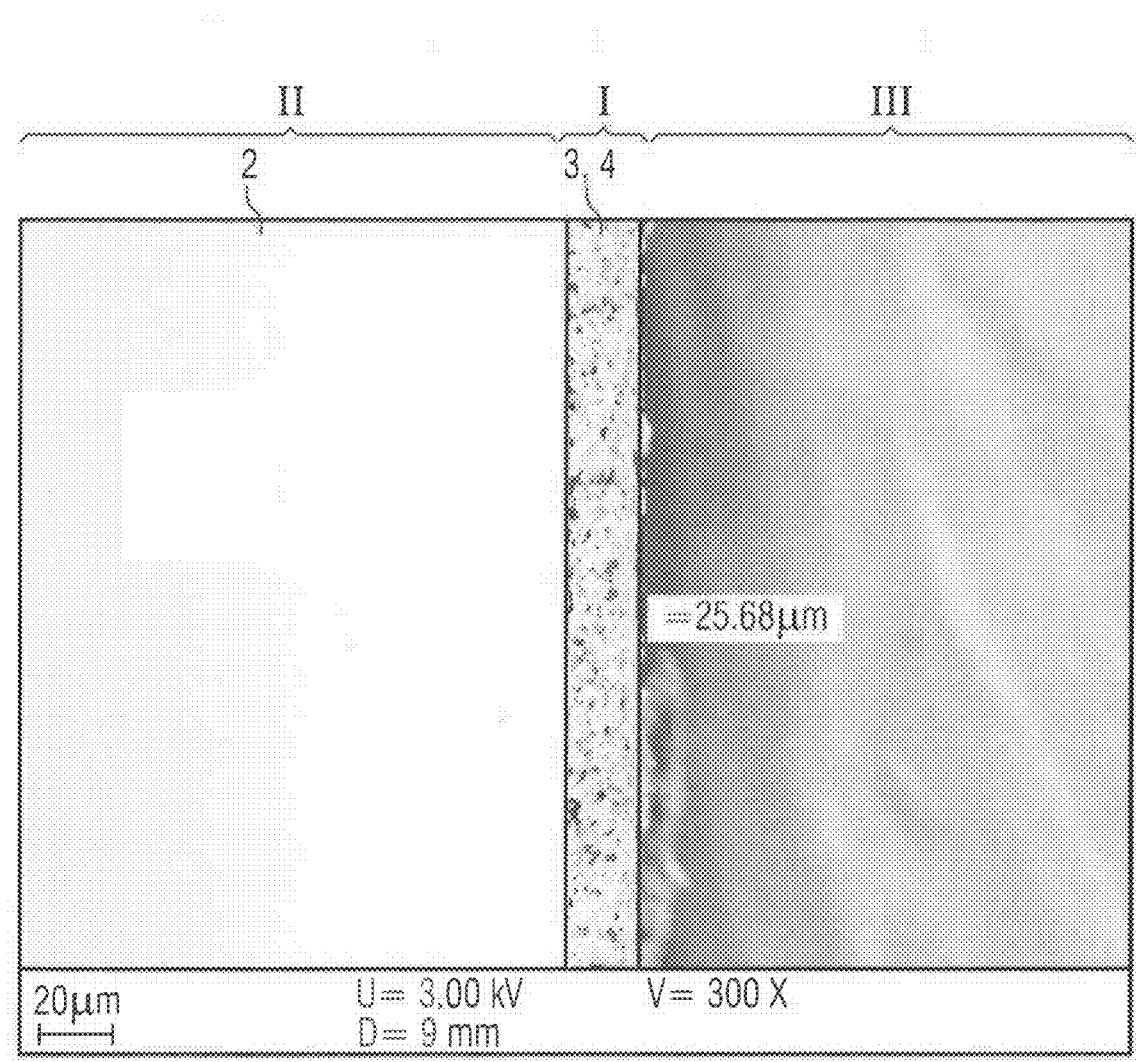
FIGS. 3A to 3I show electron microscopic images of conversion elements according to embodiments.

FIG. 3A shows a side view of an electron microscopic image of the conversion element 100 with water glass as matrix material 3, marked here with area I. The conversion element 100 can be used for a headlight. Potassium water glass with a chemical hardener, for example, aluminum phosphate, is used as matrix material 3. The chemical curing is carried out by ion exchange, in this case potassium ions by aluminum ions. This means that aluminum ions are incorporated into the silicate network, which increases humidity resistance. Potassium phosphate is produced as a by-product.

The conversion material 4 is in particular a garnet, such as YAGaG:Ce, which emits radiation from the yellow spectral range and is formed fine-grained. The substrate 2, here marked with area II in the image, is sapphire and has a dichroic/interference layer stack, in particular of silicon dioxide and titanium dioxide, which is here not visible in the electron microscopic image. In particular, the layer stack has a thickness of approx. 3 µm. In particular, substrate 2 has a layer thickness of approx. 500 µm. The layer of water glass and conversion material has a thickness of approximately 25 µm. To the right of this layer of water glass and conversion material, an air layer is arranged, here marked area III. D indicates the working distance, U indicates the high voltage and V the magnification.

The proportion in weight percent of the conversion material 4 and chemical hardener to potassium water glass and water is 1:0.9 wt %, i.e., 52.5 wt % solid particles in a suspension. Without considering the curing agent, the conversion material to potassium water glass and water is 1:1.03 wt %, i.e., 49.2 wt % or 15.3 vol % conversion material in the suspension. After curing without considering the hardener and water, the proportion of conversion material to potassium water glass is 1:0.25 wt %, i.e., 80 wt % conversion material 4 in the conversion element 100. This corresponds to a volume proportion of approx. 55% of the conversion material 4 or approx. 45 vol % or 20 wt % of the matrix material 3 in the conversion element 100.

Figure 3B:
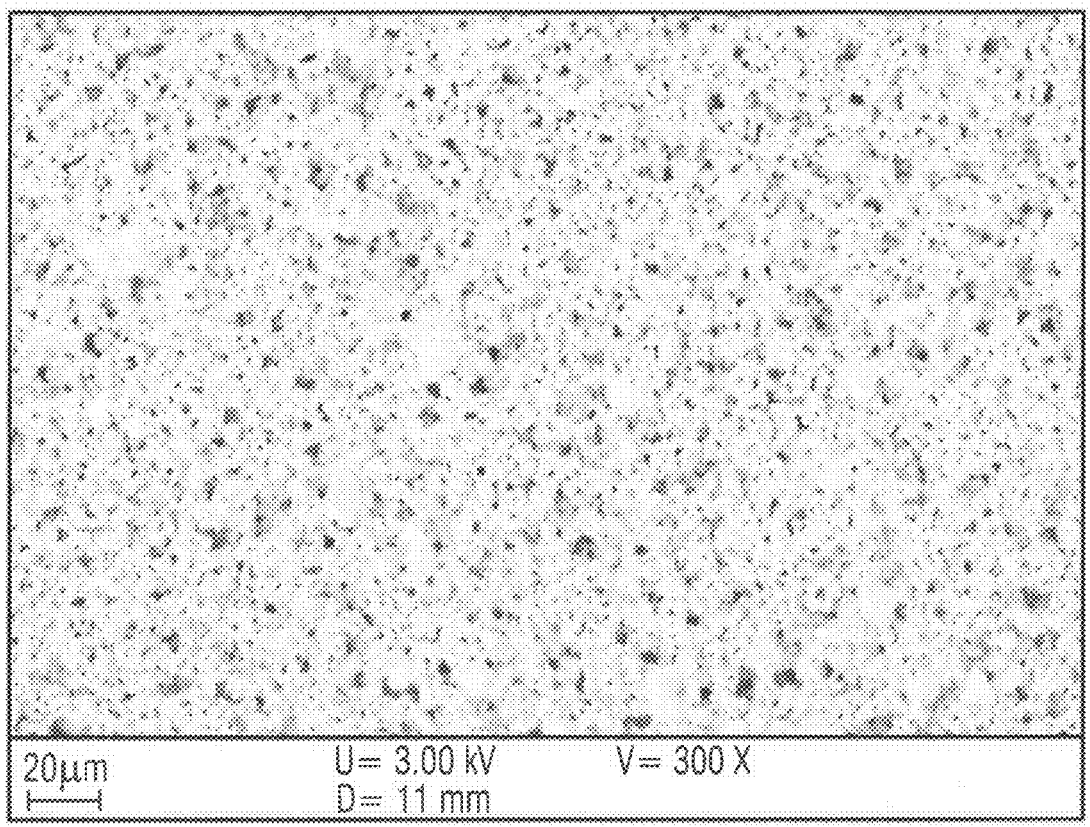

FIG. 3B shows a corresponding top view of the electron microscopic image shown in FIG. 3A.

Figure 3C:
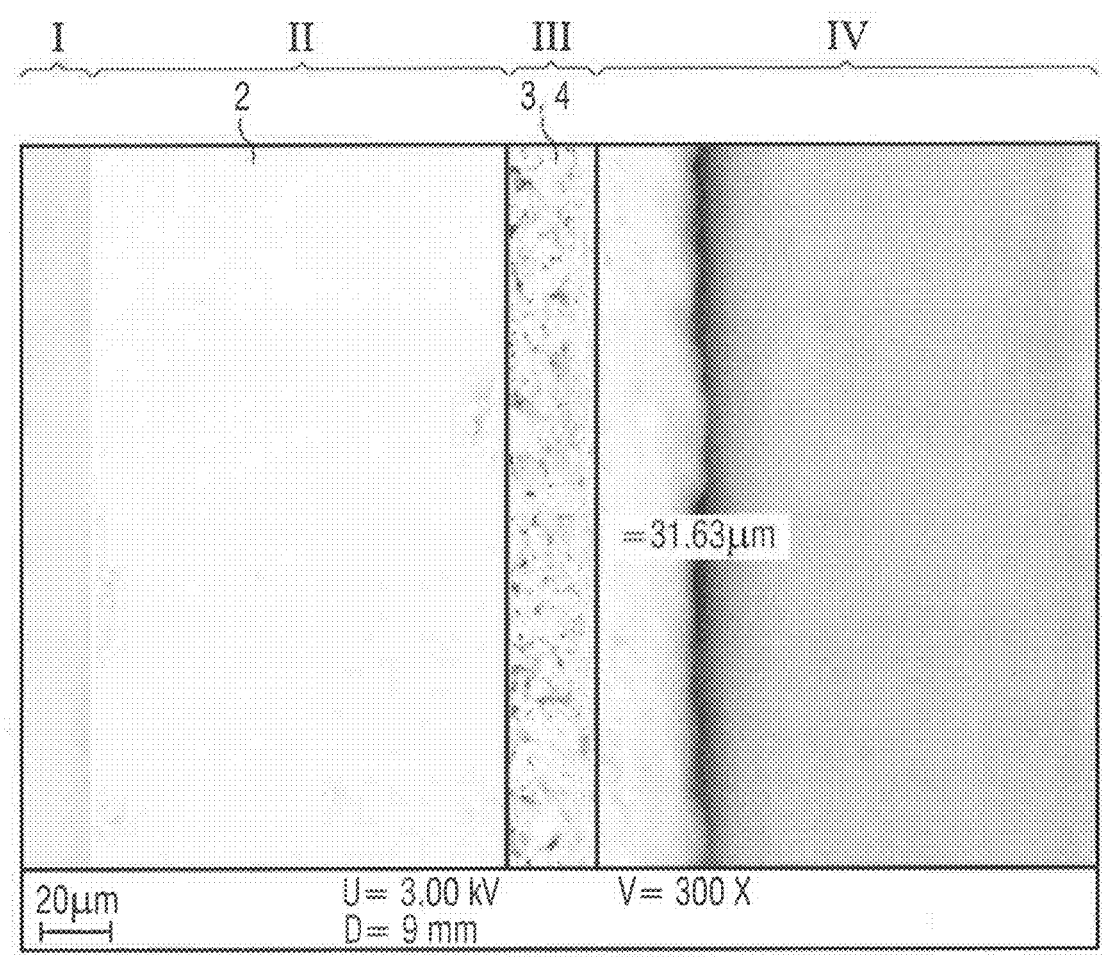

For the image of FIG. 3C, water glass was also used as matrix material 3 for the conversion element 100.

A suspension of potassium water glass was used as solution, aluminum phosphate as chemical hardener and a garnet phosphor YAGaG:Ce as conversion material 4. Optionally, the suspension was diluted with water. The mass ratio of solid components to liquid components in the suspension varied between 1:2 and 1:0.5, in particular between 1:1 and 1:0.8, preferably 1:0.5. The suspension was applied to a substrate 2, for example, by doctor blading, so that the wet coating has a layer thickness between 10 µm and 150 µm, in particular between 20 µm and 100 µm, particularly preferably between 30 µm and 80 µm. Subsequently, the coated substrate 2 was dried and cured at a temperature of between 150° C. and 350° C. The electron microscopic images (SEM) as shown in FIG. 3A were then taken. After drying and curing at 350° C., the coating thickness is approx. 30 µm. This conversion element 100 already shows a degree of conversion too high for typical cold white applications, such as headlight applications. For car headlight applications, the coating could be even thinner to achieve the appropriate color location.

By using the conversion material with a small particle size and a high activator concentration, layers with a layer thickness of only 10 µm to 20 µm can be produced after drying and curing. Such conversion elements 100 are advantageous in terms of heat dissipation and spot widening. The electron microscopic image of FIG. 3C shows from left to right an air layer (area I), the substrate 2 (area II), the matrix material 3 and the conversion material 4 (area III) and an air layer (area IV).

Figure 3D:
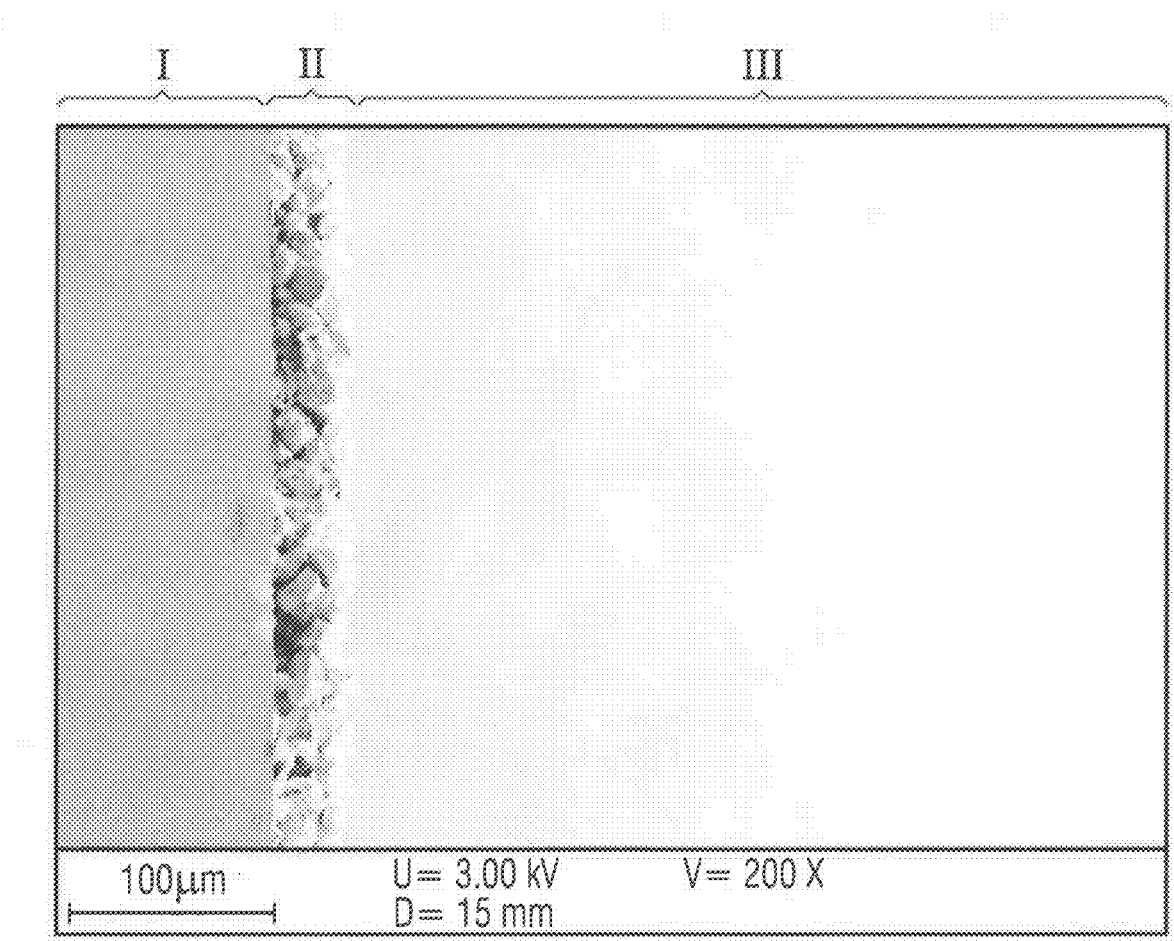

The FIG. 3D shows an example of an electron microscopic image, wherein a mixture of different water glasses is used as matrix material 3. Here, a suspension of a mixture of potassium water glass and lithium water glass as solution and a garnet (YAG:Ce) was used. Optionally, the solution can also be diluted with water. The mass ratio of the water glass is between 1 to 99 wt % lithium water glass and 99 to 1 wt % potassium water glass, in particular between 10 and 90 wt % lithium water glass and 90 and 10 wt % potassium water glass, particularly preferred between 25 and 75 wt % lithium water glass and 75 to 25 wt % potassium water glass, particularly preferred between 40 to 60 wt % lithium water glass and 60 to 40 wt % potassium water glass. In this sample, the mass ratio was 50 wt % lithium water glass to 50 wt % potassium water glass. The mass ratio between the solid and liquid components in the suspension varied between 1:1 and 1:0.1, preferably between 1:0.6 and 1:0.2, in particular between 1:0.4 and 1:0.3. In this sample the ratio was 1:0.36. The coating and the temperature treatment are carried out analogously to the example in FIG. 3C. FIG. 3D shows the electron microscopic image of a sample which was cured at 150° C. This sample is stable in the 1000 hour test at 85° C. and 85% relative humidity. After curing, the proportion of the matrix material (3) is only approx. 10 wt % or approx. 15 vol %, resulting in a conversion element 100 with a high degree of conversion material (4) filling.

Figure 3E:
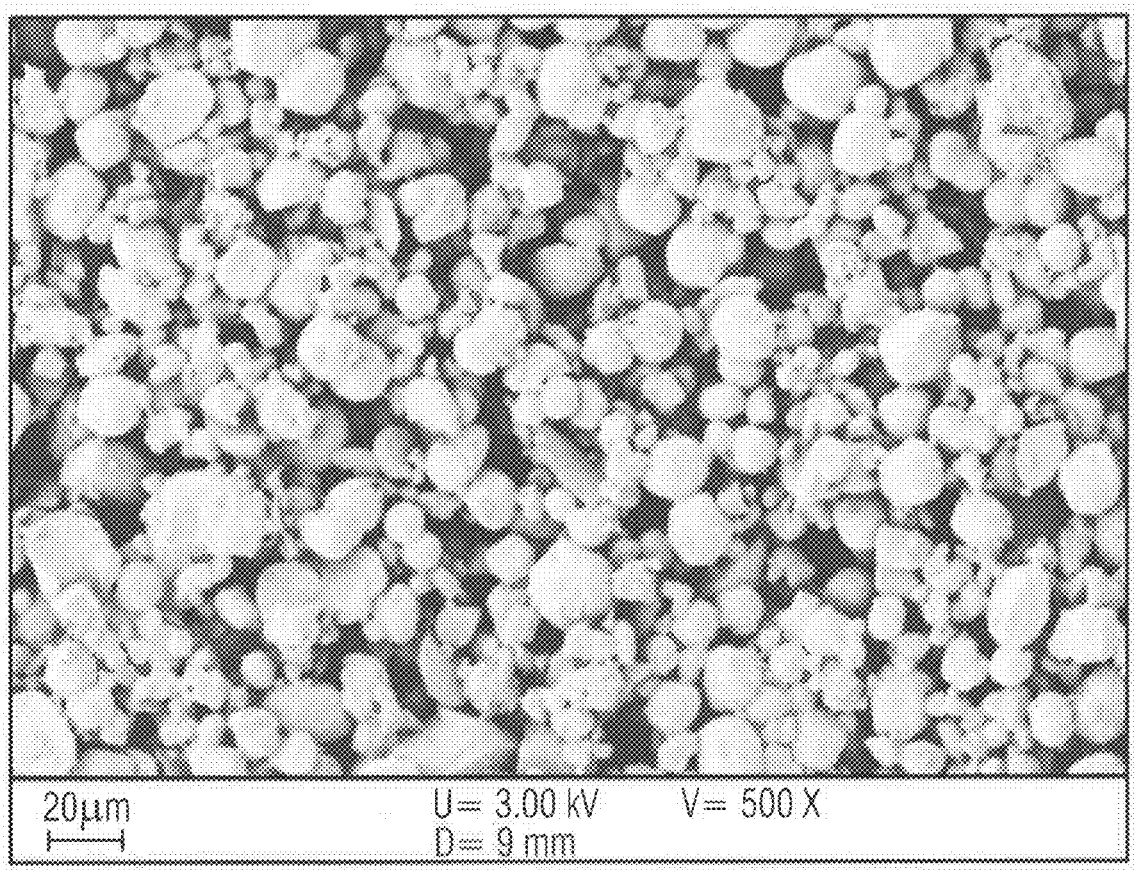
Figure 3F:
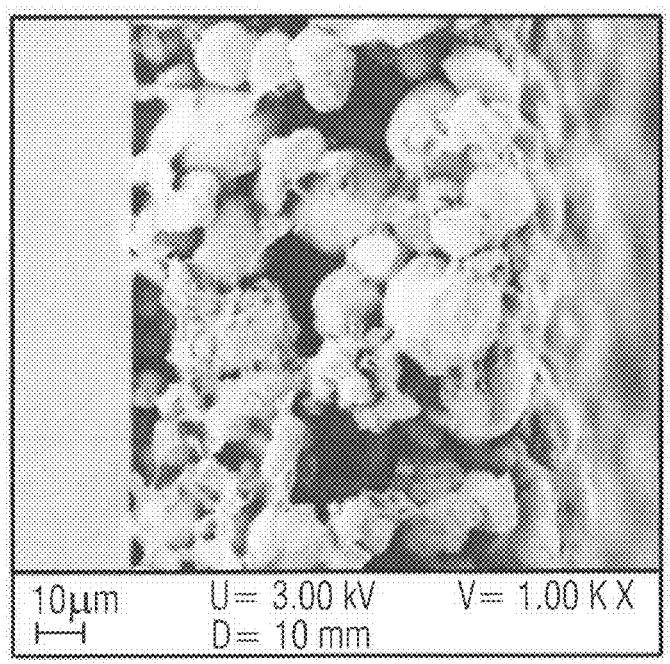

FIGS. 3E and 3F show top and side views of electron microscopic images, wherein potassium water glass with a hardener is used as matrix material 3. Matrix material 3 is excellently suited to provide a high efficiency conversion element 100. The structures are very porous compared to normal phosphor in glass (phosphor in glass, PiG).

Figure 3G:
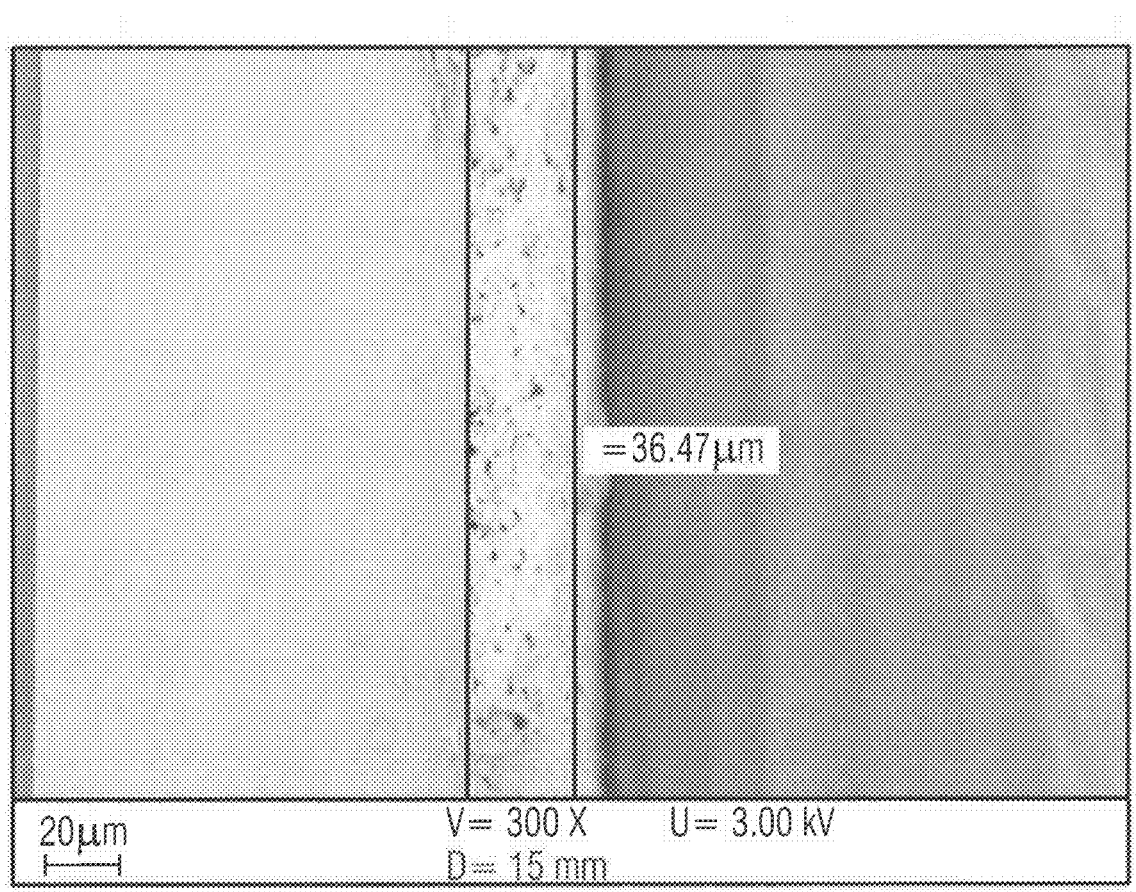

FIG. 3G shows an electron microscopic image, wherein aluminum phosphate is used as matrix material 3. Here, a suspension of modified monoaluminum phosphate as solution and a garnet (YAGaG:Ce) was used. The mass ratio of the solid components to the liquid components in the suspension is between 1:2 and 1:0.5, particularly preferred between 1:1.5 and 1:0.9, particularly preferred between 1:1.3 and 1:1. The suspension is applied to a substrate, for example, by doctor blading, wherein the wet coating has a layer thickness between 10 and 150 µm, preferably between 20 and 100 µm, particularly preferably between 30 and 80 µm. Subsequently, the substrate is dried and cured at a temperature between 300° C. and 400° C. After drying and curing at 350° C., the layer thickness is approx. 35 µm and the matrix content is approx. 60 vol % or approx. 30 wt %. Due to the higher matrix content, the gaps between the fluorescent grains are filled up more, resulting in lower porosity and a more closed surface than in the examples with water glass as matrix. The refractive index of the matrix is approx. 1.5 and that of the embedded conversion material is approx. 1.8, resulting in a high refraction difference, which is further intensified by the pores present. This results in a high scattering, which positively affects the light-dark contrast of the illuminated surface. With water glass, the refraction difference between the materials is similar, but due to the higher porosity, these layers scatter even more strongly and therefore show an even smaller beam width and an even better light-dark contrast than the layers with aluminum phosphate matrices in conjunction with a high luminance.

The electron microscopic SEM images of the FIGS. 3A, 3C, 3D, 3F, 3G and 3I show a side view of a broken conversion element 100.

Figure 3H:
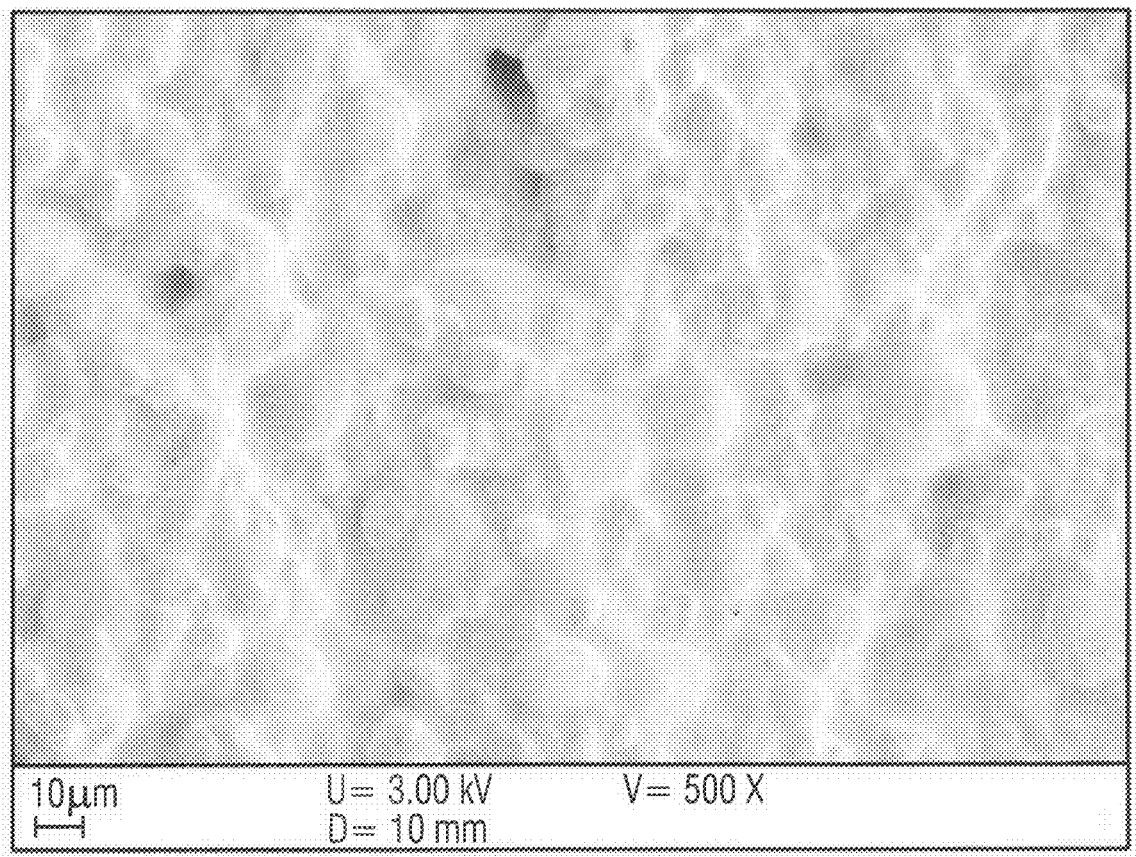
Figure 3I:
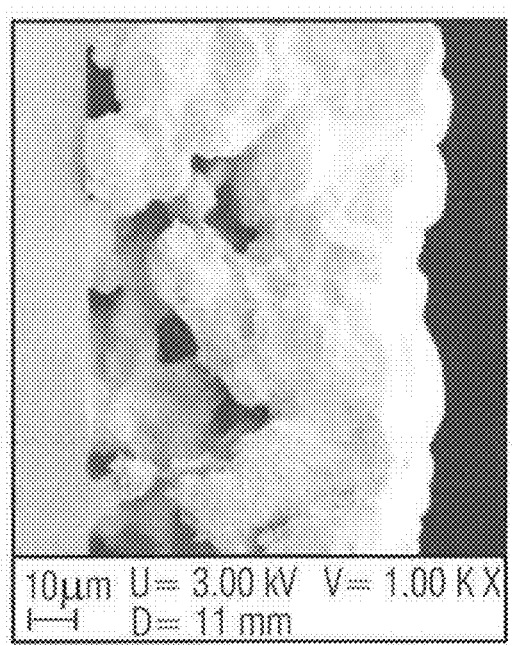

FIGS. 3H and 3I show the top view and side view of electron microscopic images of the exemplary embodiments for aluminum phosphate matrix. With this matrix material a highly efficient conversion element 100 can be provided. Excellent adhesion and separation results can be achieved. In addition, the matrix material has a porous structure, which can also be produced more densely. The conversion elements can therefore be produced cost-effectively in wafer size. These are then cut into smaller conversion elements, for example, using a diamond saw. Good adhesion of the layer and good layer stability are required to prevent chipping or breaking at the edges during sawing.

FIG. 4A shows the spatially resolved luminance of a so-called static LARP component according to an embodiment with water glass as matrix material 3. Static measurement here means that the laser source 1 is directed at the conversion element 100 without the beam of the laser source 1 moving on the conversion element 100. The blue excitation of the laser beam is approximately 50 µm×250 µm ($1/e^2$). The area comprises the intensity range which is within the $1/e^2$ value of the maximum. A blue input power of approximately 0.66 W is set. The converter temperature is 80° C. Substrate 2 is a sapphire substrate with a dichroic coating or a dichroic layer stack and may have an anti-reflection coating on the opposite side. The width of the image is approximately 1 mm. The measurements show that the emission spot for the conversion material 4 in the matrix material 3 water glass is smaller than for a ceramic converter (FIG. 4B).

FIG. 4C shows each the luminance of a dynamic LARP component according to an embodiment with water glass as matrix material 3 with $L_{max}$ approx. 110 Mcd/m². Dynamic means that the laser beam scans the conversion element 100, i.e., moves on the conversion element 100. The scanning frequency is 133 Hz. A blue excitation with approximately 50 µm×250 µm ($1/e^2$) takes place. The blue input power is approximately 1.6 W and the converter temperature is 80° C. Substrate 2 is a sapphire substrate with a dichroic layer stack located between the substrate and conversion element. On the opposite side of the substrate (laser-facing side), the substrate has an anti-reflection layer. The width of the scanning image is approximately 9.5 mm.

FIG. 4D shows a comparison example with a ceramic converter which is adhered to the dichroic layers of the substrate with silicone. A comparison with images 4C and 4D shows that the conversion element 100 according to an embodiment has excellent optical properties, as the beam width in the conversion element is also significantly smaller here, resulting in a better light-dark contrast. This is particularly important for an automotive application.

Figure 5A:
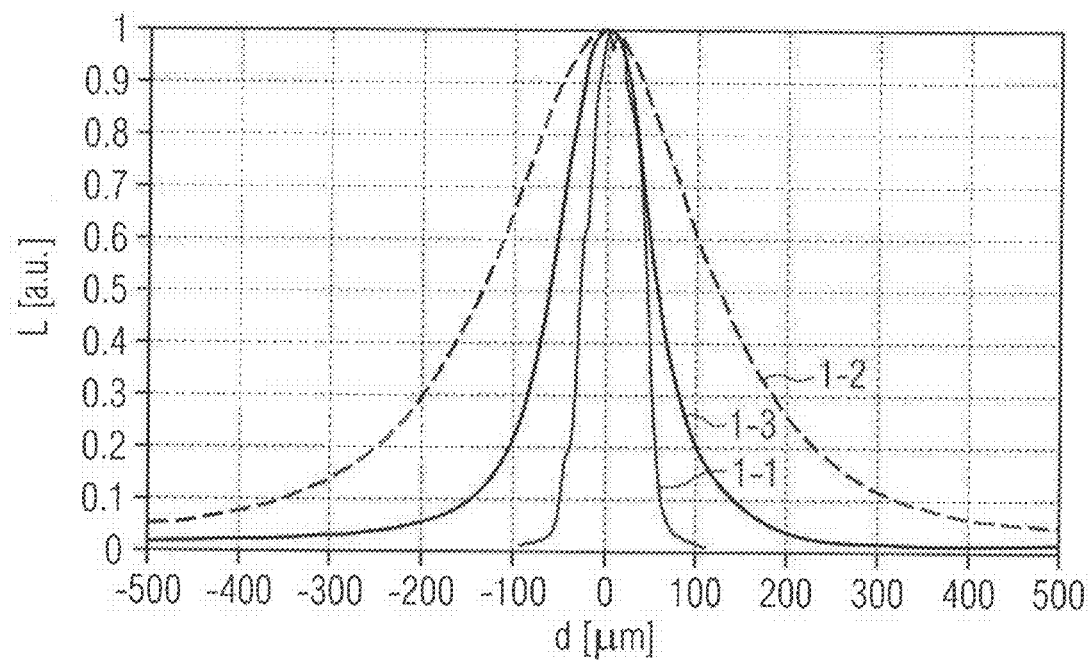

FIG. 5A shows the relative luminance in a.U. (arbitrary units) as a function of the distance d in µm of the laser beam 1-1, a conventional ceramic converter 1-2 and a conversion element 1-3 according to an embodiment formed as a dynamic LARP. The scanning frequency is 133 Hz. The blue excitation spot is approximately 50 µm×250 µm ($1/e^2$). The blue input power is approximately 1.6 W. The converter temperature is 80° C. The substrate used was a sapphire substrate with a dichroic layer stack and an anti-reflection coating. FIG. 5A shows the advantage of the conversion element 100 with the matrix material water glass compared to conventional ceramic converters in that the emitted light is pronounced significantly smaller at comparable luminance, i.e., has less spot widening. This means that less halo/corona/scattered light is produced and thus a better light-dark contrast is available. The $1/e^2$ width is 250 µm for the conversion element 100 with water glass and 575 µm for the ceramic converter.

Figure 5B:
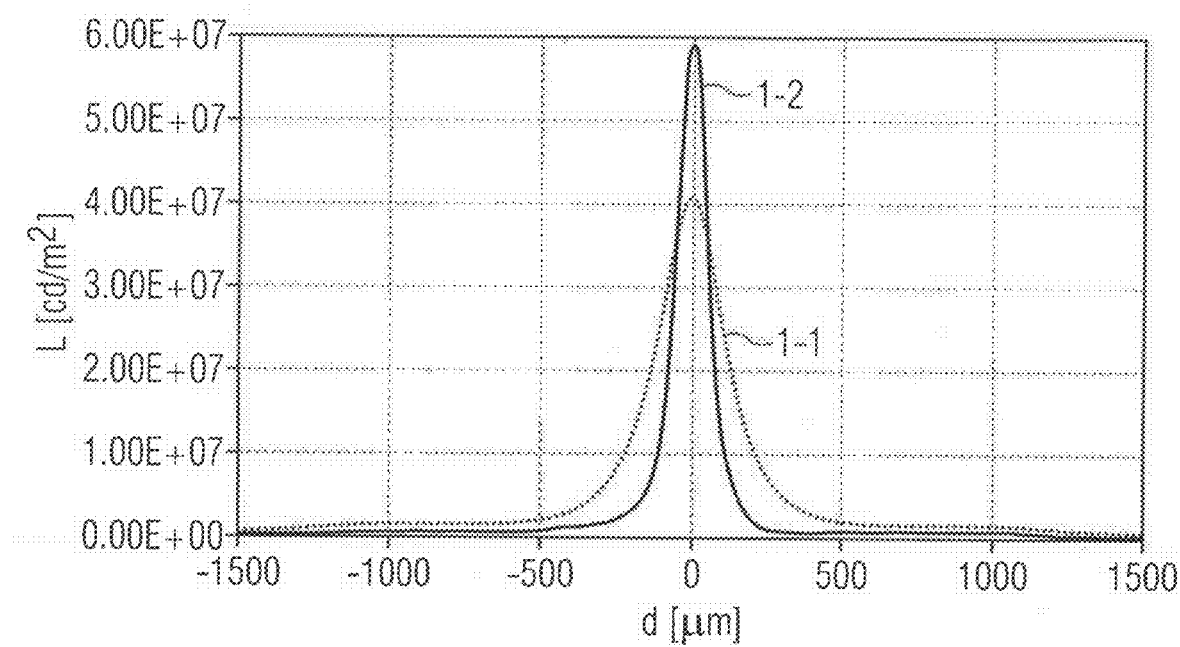

FIG. 5B shows the luminance curve L in cd/m² of a conventional ceramic converter 1-1 and a conversion element 1-2 according to an embodiment as a dynamic LARP component. For the scanning frequency, the blue excitation spot, the power, the converter temperature and the substrate, the same specifications apply as for FIG. 5A. Here, too, the conversion element 100 with the matrix material water glass shows a smaller half-width than the conventional ceramic converter. The peak of the conversion element of the embodiment is higher than the peak of the conventional ceramic converter, which means a higher luminance. In addition, the spot widening of the conversion element of the embodiment is smaller. The contrast, here indicated as the ratio of the intensity at a distance of 1 mm from the peak to the peak intensity, is approx. 1:95 for the water glass and approx. 1:30 for the conventional ceramic. The intensity of the conversion element of the embodiment decreases faster with increasing distance from the peak than for the ceramic converter. This results in less halo/corona/scattered light in the conversion element of the embodiment and thus a better light-dark contrast.

The exemplary embodiments described in conjunction with the figures and their features can also be combined with each other according to further exemplary embodiments, even if such combinations are not explicitly shown in the figures. Furthermore, the exemplary embodiments described in conjunction with the figures may have additional or alternative features as described in the general part of the description.

The invention is not limited by the description of the exemplary embodiments to these. Rather, the invention includes each new feature and each combination of features, which in particular includes each combination of features in the patent claims, even if that feature or combination itself is not explicitly stated in the patent claims or exemplary embodiments.

The invention claimed is:

1. An arrangement comprising:
a conversion element comprising:
a wavelength converting conversion material;
a matrix material in which the conversion material is embedded; and
a substrate on which the matrix material with the embedded conversion material is directly arranged,
wherein the matrix material comprises at least one condensed sol-gel material selected from the group consisting of water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, and metal alkoxane; and
a laser source configured to emit primary radiation during operation,
wherein the conversion element is arranged in a beam path of the laser source,
wherein the conversion element is mechanically immovably mounted with respect to the laser source,
wherein the primary radiation of the laser source is dynamically arranged to the conversion element,
wherein the conversion element is formed as a layer with a maximum layer thickness of 40 μm, and
wherein the conversion element comprises a porosity of more than 0.1 vol % in the matrix material.

2. The arrangement according to claim 1,
wherein the matrix material comprises the aluminum phosphate, the monoaluminum phosphate, the modified monoaluminum phosphate, or the water glass,
wherein the conversion material is configured to absorb the primary radiation and to convert the primary radiation at least partially into secondary radiation of a different wavelength,
wherein the substrate is a sapphire substrate, and
wherein the substrate is arranged in the beam path of the primary radiation or the secondary radiation.

3. The arrangement according to claim 1, wherein the conversion material and the matrix material comprise inorganic materials.

4. The arrangement according to claim 1, wherein the matrix material comprises the condensed sol-gel with a proportion of between 10 and 65 vol % or between 5 and 40 wt %, and wherein a refraction difference to the conversion material is >0.2.

5. The arrangement according to claim 1, wherein the laser source is configured to emit the primary radiation with a dominant wavelength between 430 nm and 470 nm inclusive.

6. The arrangement according to claim 1, wherein the matrix material is free of silicone and/or epoxy.

7. The arrangement according to claim 1, wherein the matrix material consists essentially of the aluminum phosphate, the monoaluminum phosphate or the modified monoaluminum phosphate.

8. The arrangement according to claim 1, wherein the matrix material consists essentially of the water glass and a chemical hardener.

9. The arrangement according to claim 1, wherein the matrix material comprises at least lithium water glass, sodium water glass, potassium water glass or a mixture thereof.

10. The arrangement according to claim 1, wherein the conversion material is configured to:
absorb the primary radiation of the laser source;
convert the primary radiation into secondary radiation with a longer wavelength; and
emit the secondary radiation.

11. The conversion element according to claim 1, wherein the conversion material is configured to:
completely absorb the primary radiation of the laser source; and
emit the converted primary radiation as secondary radiation with a longer wavelength.

12. The arrangement according to claim 1, wherein the conversion material is configured to:
partially absorb the primary radiation of the laser source; and
emit the converted primary radiation as secondary radiation with a longer wavelength so that total radiation emerging from the conversion element is composed of the primary radiation and the secondary radiation.

13. The arrangement according to claim 1, wherein the primary radiation impinges on the conversion element via a transmissive substrate.

14. The arrangement according to claim 1, wherein the conversion material is selected from the group consisting of garnet, orthosilicate, and nitridosilicate.

15. An arrangement comprising:
a conversion element comprising:
a wavelength converting conversion material;
a matrix material in which the conversion material is embedded; and
a substrate on which the matrix material with the embedded conversion material is directly arranged,
wherein the matrix material comprises at least one condensed sol-gel material selected from the group consisting of water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, and metal alkoxane; and
a laser source configured to emit primary radiation during operation,
wherein the conversion element is arranged in a beam path of the laser source,
wherein the conversion element is mechanically immovably mounted with respect to the laser source, and
wherein the primary radiation of the laser source is dynamically arranged to the conversion element, wherein the conversion element comprises a dichroic layer stack arranged between the substrate and the matrix material, wherein the substrate and the dichroic layer stack are configured to be transmissive with respect to at least a part of the primary radiation, wherein the conversion material is configured to convert the primary radiation into secondary radiation, and wherein the dichroic layer stack is configured to reflect the secondary radiation.

16. The arrangement according to claim 15, wherein the conversion element comprises a porosity of more than 0.1 vol % in the matrix material.

17. The arrangement according to claim 1, wherein the arrangement comprises exactly one conversion element.

18. A method for producing a conversion element, the method comprising:
providing a matrix material;
introducing an inorganic wavelength converting conversion material into the matrix material;
forming the matrix material by a sol-gel process at a temperature of between 150° C. and 400° C. inclusive; and
applying the matrix material with the introduced conversion material directly on a substrate, wherein the matrix material comprises at least one condensed sol-gel material selected from the group consisting of water glass, metal phosphate, aluminum phosphate, monoaluminum phosphate, modified monoaluminum phosphate, alkoxytetramethoxysilane, tetraethylorthosilicate, methyltrimethoxysilane, methyltriethoxysilane, titanium alkoxide, silica sol, metal alkoxide, metal oxane, and metal alkoxane, and wherein the conversion element is a layer with a maximum layer thickness of 40 μm and a porosity of more than 0.1 vol % in the matrix material.

19. The arrangement according to claim 15, wherein the conversion element is formed as a layer with a maximum layer thickness of 40 μm.

* * * * *